United States Patent
Gribok et al.

(10) Patent No.: US 10,715,144 B2
(45) Date of Patent: Jul. 14, 2020

(54) LOGIC CIRCUITS WITH AUGMENTED ARITHMETIC DENSITIES

(71) Applicant: Intel Corporation, Santa Clara, CA (US)

(72) Inventors: Sergey Gribok, Santa Clara, CA (US); Gregg Baeckler, San Jose, CA (US); Martin Langhammer, Alderbury (GB)

(73) Assignee: Intel Corporation, San Jose, CA (US)

( * ) Notice: Subject to any disclaimer, the term of this patent is extended or adjusted under 35 U.S.C. 154(b) by 0 days.

(21) Appl. No.: 16/434,088

(22) Filed: Jun. 6, 2019

(65) Prior Publication Data

US 2019/0288688 A1 Sep. 19, 2019

(51) Int. Cl.
| | |
|---|---|
| *H03K 19/0175* | (2006.01) |
| *H03K 19/20* | (2006.01) |
| *H03K 19/1778* | (2020.01) |
| *G06F 7/50* | (2006.01) |
| *G06F 7/53* | (2006.01) |

(52) U.S. Cl.
CPC ....... *H03K 19/017581* (2013.01); *G06F 7/50* (2013.01); *G06F 7/5306* (2013.01); *H03K 19/1778* (2013.01); *H03K 19/20* (2013.01)

(58) Field of Classification Search
CPC ....... H03K 19/017581; H03K 19/1778; H03K 19/20; G06F 7/5306; G06F 7/50
USPC .......................................................... 326/38
See application file for complete search history.

(56) References Cited

U.S. PATENT DOCUMENTS

| | | |
|---|---|---|
| 5,561,619 A | 10/1996 | Wantanabe et al. |
| 5,848,285 A | 12/1998 | Kapusta et al. |
| 6,157,209 A | 12/2000 | McGettigan |
| 6,288,570 B1 | 9/2001 | New |
| 6,516,331 B2 | 2/2003 | Beiu |
| 6,708,191 B2 * | 3/2004 | Chapman ........... H03K 19/1737 326/39 |
| 7,185,035 B1 | 2/2007 | Lewis et al. |
| 7,193,436 B2 | 3/2007 | Wang et al. |
| 7,218,139 B1 | 5/2007 | Young et al. |
| 7,233,168 B1 | 6/2007 | Simkins |
| 7,236,008 B1 | 6/2007 | Cliff |

(Continued)

OTHER PUBLICATIONS

Langhammer et al., "High Density and Performance Multiplication for FPGA", 25th IEEE Symbosium on Computer Arithmetic (ARITH 2018) <http://www.ecs.umass.edu/arith-2018/program.html#content>.

(Continued)

*Primary Examiner* — Daniel D Chang

(74) *Attorney, Agent, or Firm* — Treyz Law Group, P.C.; Jason Tsai

(57) ABSTRACT

Integrated circuits with programmable logic regions are provided. The programmable logic regions may be organized into smaller logic units sometimes referred to as a logic cell. A logic cell may include four 4-input lookup tables (LUTs) coupled to an adder carry chain. Each of the four 4-input LUTs may include two 3-input LUTs and a selector multiplexer. The carry chain may include at three or more full adder circuits. The outputs of the 3-input LUTs may be directly connected to inputs of the full adder circuits in the carry chain. By providing at least the same or more number of full adder circuits as the total number of 4-input LUTs in the logic cell, the arithmetic density of the logic is enhanced.

20 Claims, 12 Drawing Sheets

(56) References Cited

U.S. PATENT DOCUMENTS

| | | | |
|---|---|---|---|
| 7,260,595 | B2 | 8/2007 | Talwar et al. |
| 7,565,388 | B1 * | 7/2009 | Baeckler ................ G06F 7/509 |
| | | | 708/235 |
| 7,663,400 | B1 | 2/2010 | Plants |
| 7,902,864 | B1 | 3/2011 | Hutton et al. |
| 8,392,488 | B1 | 3/2013 | Langhammer |
| 8,447,798 | B2 | 5/2013 | Langhammer |
| 8,510,357 | B1 | 8/2013 | Langhammer |
| 8,521,801 | B2 | 8/2013 | Pistorius et al. |
| 8,713,081 | B2 | 4/2014 | Langhammer |
| 2015/0121035 | A1 | 4/2015 | Steele et al. |

OTHER PUBLICATIONS

Boutros et al., "Math Doesn't Have to be Hard: Logic Block Architectures to Enhance Low-Precision Multiply-Accumulate on FPGAs", The 2019 ACM/SIGDA International Symposium on Field-Programmable Gate Arrays (FPGA '19), Feb. 24-26, 2019, Seaside, CA, USA. ACM, New York, NY, USA, 10 pages. https://doi.org/10.1145/3289602.3293912.

* cited by examiner

600

|   |   |   |   |   |   | a5 | a4 | a3 | a2 | a1 | a0 |
|---|---|---|---|---|---|----|----|----|----|----|----|
|   |   |   |   |   | × | b5 | b4 | b3 | b2 | b1 | b0 |

|      |      |      |      |      | b0a5 | b0a4 | b0a3 | b0a2 | b0a1 | b0a0 | }601 |
|------|------|------|------|------|------|------|------|------|------|------|------|
|      |      |      |      | b1a5 | b1a4 | b1a3 | b1a2 | b1a1 | b1a0 |      | }602 |
|      |      |      | b2a5 | b2a4 | b2a3 | b2a2 | b2a1 | b2a0 |      |      | }603 |
|      |      | b3a5 | b3a4 | b3a3 | b3a2 | b3a1 | b3a0 |      |      |      | }604 |
|      | b4a5 | b4a4 | b4a3 | b4a2 | b4a1 | b4a0 |      |      |      |      | }605 |
| b5a5 | b5a4 | b5a3 | b5a2 | b5a1 | b5a5 |      |      |      |      |      | }606 |

650

|    |    | s7 | s6 | s5 | s4 | s3 | s2 | s1 | s0 | }607 |
|----|----|----|----|----|----|----|----|----|----|------|
| t7 | t6 | t5 | t4 | t3 | t2 | t1 | y0 |    |    | }608 |
| u7 | u6 | u5 | u4 | u3 | u2 | u1 | u0 |    |    | }609 |

| u7 | u6 |    | s7 | s6 | s5 | s4 | s3 | s2 | s1 | s0 |
|----|----|----|----|----|----|----|----|----|----|----|
|    | v6 | v5 | v4 | v3 | v2 | v1 | v0 | t1 | t0 |    | out11 out10 out9 out8 out7 out6 out5 out4 out3 out2 out1 out0

FIG. 6

LOGIC CIRCUITS WITH AUGMENTED ARITHMETIC DENSITIES

BACKGROUND

This relates to integrated circuits such as programmable integrated circuits.

Programmable integrated circuits such as programmable logic devices (PLDs) can be programmed by a user to implement a desired custom logic function. In a typical scenario, a logic designer uses computer-aided design (CAD) tools to design a custom logic circuit. When the design process is complete, the tools generate configuration data. The configuration data is loaded into programmable integrated circuit memory elements to configure the device to perform the functions of the custom logic circuit. In particular, the configuration data configures programmable interconnects, programmable routing circuits, and programmable logic circuits in the programmable integrated circuits.

Programmable logic devices include programmable logic circuitry organized into logic units sometimes referred to as adaptive logic modules. A conventional adaptive logic module includes four 4-input lookup tables, only one or two adders, and associated routing circuitry. Having only a pair of adders places a cap on the arithmetic density of the ALM. In arithmetic mode, the amount of routing circuitry is also disproportionately large in comparison to the number of adders (i.e., existing PLDs include too much routing while only supporting small precision arithmetic). The limited arithmetic densities of conventional programmable devices makes it challenging for such devices to compete with other types of computing devices such as graphics processing units and application specific standard products.

It is within this context that the embodiments described herein arise.

BRIEF DESCRIPTION OF THE DRAWINGS

FIG. 6 is a table illustrating how a 6-by-6 unsigned multiplication can be computed in accordance with an embodiment.

DETAILED DESCRIPTION

The present embodiments relate to programmable integrated circuits (e.g., a field programmable gate array or "FPGA") and more particularly, to programmable integrated circuits that include logic cells each of which include more than two full adder circuits. In one suitable arrangement, a logic cell may include at least three full adders. In another suitable arrangement, a logic cell may include four full adders. If desired, a logic cell may include more than four full adders. Each logic cell may include four 4-input lookup table (LUT) circuits, each of which is decomposed into two 3-input LUT circuits. The outputs from the decomposed 3-input LUTs may be directly routed to the various adders in the cell. In certain embodiments, some of the adders in the logic cell need not be used and can be bypassed. Such types of logic cells can be configured to support binary, ternary, or even quaternary addition and can be used to efficiently implement multipliers (e.g., either small precision multipliers or large precision multipliers).

Configured in this way, the arithmetic density of a logic cell can be increased by 20-100%+ depending on the application at minimal cost. Thus, a programmable logic device using such type of logic cells offers an improvement to computer functionality by being cost optimized and backwards compatible with modern FPGA architectures while providing increased arithmetic density and flexibility to implement additions, multiplications, and other numeric functions more effectively and efficiently.

It will be recognized by one skilled in the art, that the present exemplary embodiments may be practiced without some or all of these specific details. In other instances, well-known operations have not been described in detail in order not to unnecessarily obscure the present embodiments.

Figure 1:
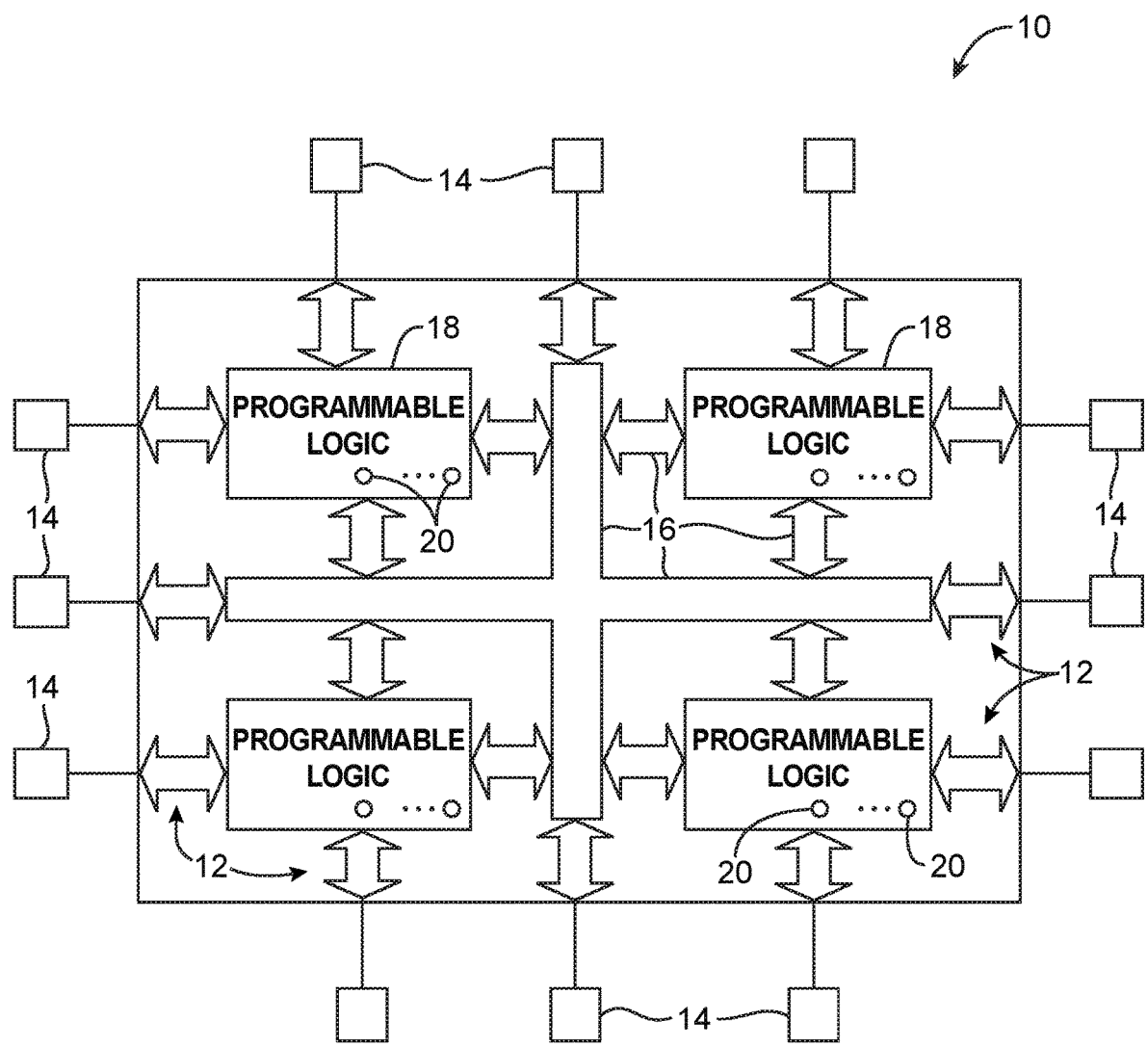
FIG. 1 is a diagram of an illustrative programmable integrated circuit in accordance with an embodiment.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18 may include combinational and sequential logic circuitry. For example, programmable logic regions 18 may include look-up tables, registers, and multiplexers. Programmable logic regions 18 may be configured to perform one or more custom logic functions.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
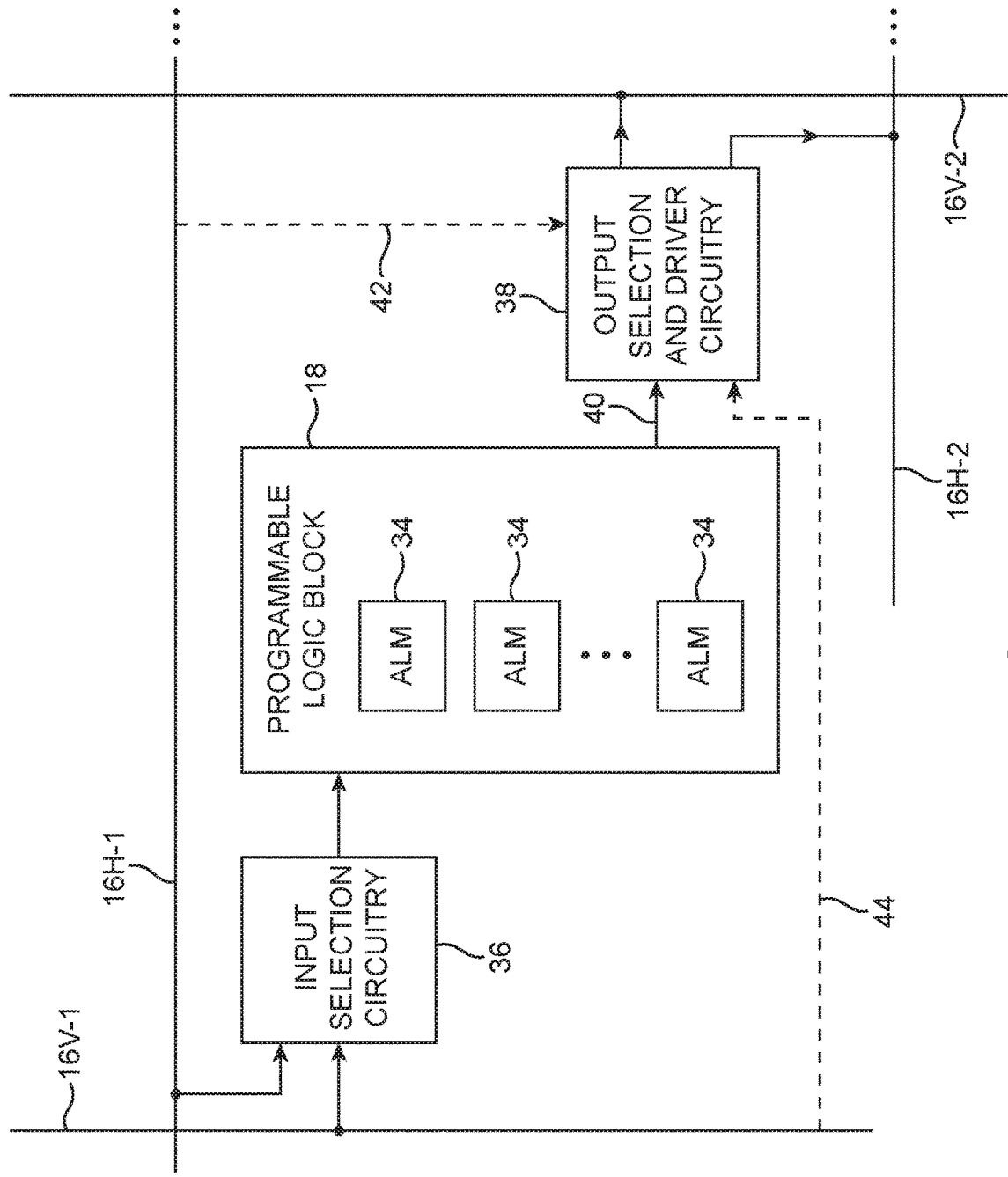
FIG. 2 is a diagram of an illustrative programmable logic block in accordance with an embodiment.

An illustrative programmable logic region 18 including a group of multiple smaller logic regions 34 is shown in FIG. 2. Programmable logic region 18, sometimes referred to as a logic array block (LAB), may have associated input selection circuitry 36 and output selection and driver circuitry 38. Input selection circuitry 36 may receive input signals via a first set of horizontal interconnects 16H-1 and a first set of vertical interconnects 16V-1. For example, interconnects 16H-1 may provide input signals to programmable logic block 18 from other programmable logic blocks 18 in the same row or from input/output pins 14, whereas interconnects 16V-1 may provide input signals to programmable logic block 18 from other logic blocks 18 in the same column or from pins 14. Input selection circuitry 36 may be configured (e.g., by programming CRAM bits that are associated with input selection circuitry 36) to select one or more of the input signals to provide to programmable logic block 18.

As shown in FIG. 2, programmable logic block 18 may include smaller regions of programmable logic 34. The smaller programmable logic regions 34 within each programmable logic region 18 are sometimes referred to as adaptive logic modules (ALMs), logic elements (LEs), or logic cells. A logic cell 34 may receive the input signals that are selected by input selection circuitry 36 and may perform custom functions on the input signals to produce output signals. The input signals received by each logic cell 34 may overlap with input signal portions received by other logic cells 34 (e.g., some of the input signals received by a first logic region 34 may also be received by a second logic region 34). There may be any suitable number of logic cells 34 within logic block 18.

The output signals may be provided to output selection and driver circuitry 38 via output paths 40. Output selection and driver circuitry 38 may receive output signals via paths 40 and may be configured to provide the output signals to a second set of horizontal interconnects 16H-2 and a second set of vertical interconnects 16V-2. If desired, output selection circuitry 38 may be configured to disconnect one or more of interconnects 16H-2 or 16V-2 (e.g., by providing no output signal or by providing a high impedance output). If desired, output selection circuitry 38 may be configured to provide a given output signal to multiple interconnects. For example, it may be desirable to route an output signal from a given logic element 34 to two different regions of integrated circuit 10. In this scenario, output selection and driver circuitry 38 may provide that output signal to two different interconnects of different lengths.

In some arrangements, input selection circuitry 36 may include LAB input multiplexers (LIMs) that can be used to select signals from a horizontal channel, a vertical channel, and local outputs from one or more logic elements 34 and to drive a set of LAB lines. The input selection circuitry 36 may also include logic element input multiplexers (LEIMs) that can be used to select signals from some set of LAB lines and to drive the selected signals to logic elements 34. Output selection circuitry 38 may include driver input multiplexers (DIMs) that can be used to select signals from a horizontal channel, a vertical channel, and local outputs from one or more logic cells and to drive wires, which originate in that logic block 18 and route to other logic blocks 18.

Figure 3:
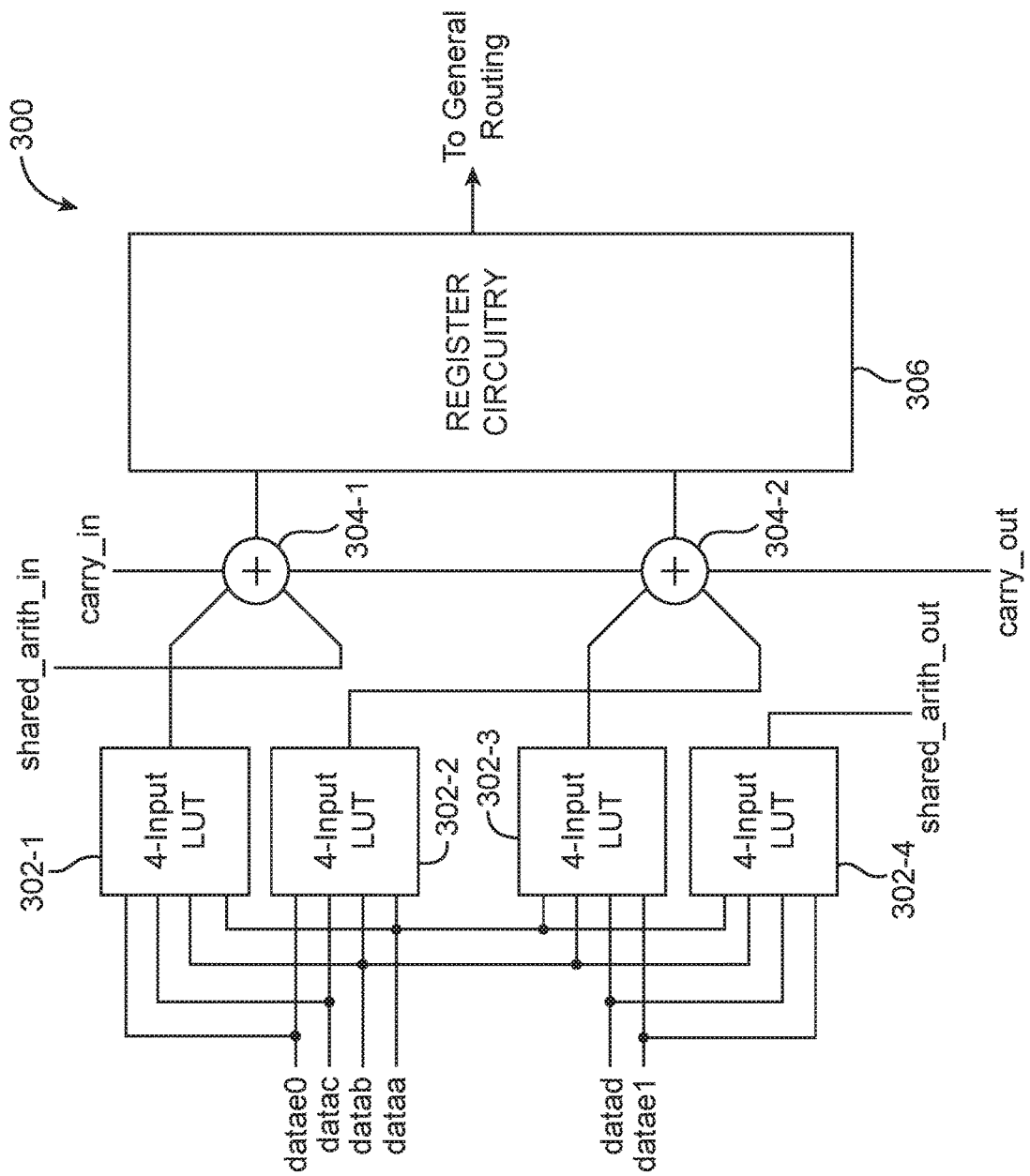
FIG. 3 is a diagram of an adaptive logic module that implements a 3:2 compressor to support ternary addition.

FIG. 3 is a diagram of an adaptive logic module (ALM) 300 that implements a 3:2 compressor to support ternary addition. As shown in FIG. 3, ALM 300 includes four 4-input lookup tables (LUTs) 302, a carry chain with only two adders 304-1 and 304-2, and register circuitry 306. The ALM 300 receives six inputs dataa, datab, datac, datad, datae0, and datae1. A first LUT 302-1 is configured to receive inputs dataa, datab, datac, and datae0; a second LUT 302-1 is also configured to receive inputs dataa, datab, datac, and datae0; a third LUT 302-3 is configured to receive inputs dataa, datab, datad, and data e1; and a fourth LUT 302-4 is also configured to receive inputs dataa, datab, datad, and data e1.

The first adder 304-1 has a first adder input connected to the output of first LUT 302-1, a second adder input that receives signal shared_arith_in from a preceding ALM, a carry input that receives signal carry_in from the preceding ALM, a sum output connected to register circuitry 306, and a carry output. The second adder 304-2 has a first adder input connected to the output of first LUT 302-3, a second adder input connected to the output of second LUT 302-2, a carry input connected to the carry output of adder 304-1, a sum output connected to register circuitry 306, and a carry output at which signal carry_out is provided to a subsequent ALM. Fourth LUT 302-4 has an output at which signal shared_arith_out is fed to the subsequent ALM. Register circuitry 306 is then coupled to general routing circuitry within the programmable device.

Configured in this way, ALM 300 is operable in a shared arithmetic mode to support ternary addition (i.e., to support the addition of three different input words). In particular, LUTs 302-1, 302-2, 302-3, and 302-4 may serve collectively as a 3:2 compressor before routing the signals to the two-adder carry chain. Ternary additions can implement multiple additions in a recursive reduction tree in half the number of nodes as a typical binary adder. However, one of the problems with ternary addition is that the number of inputs (i.e., 3 per bit) exceeds the maximum number that can be supported with a typical 50% depopulated input crossbar.

Figure 4:
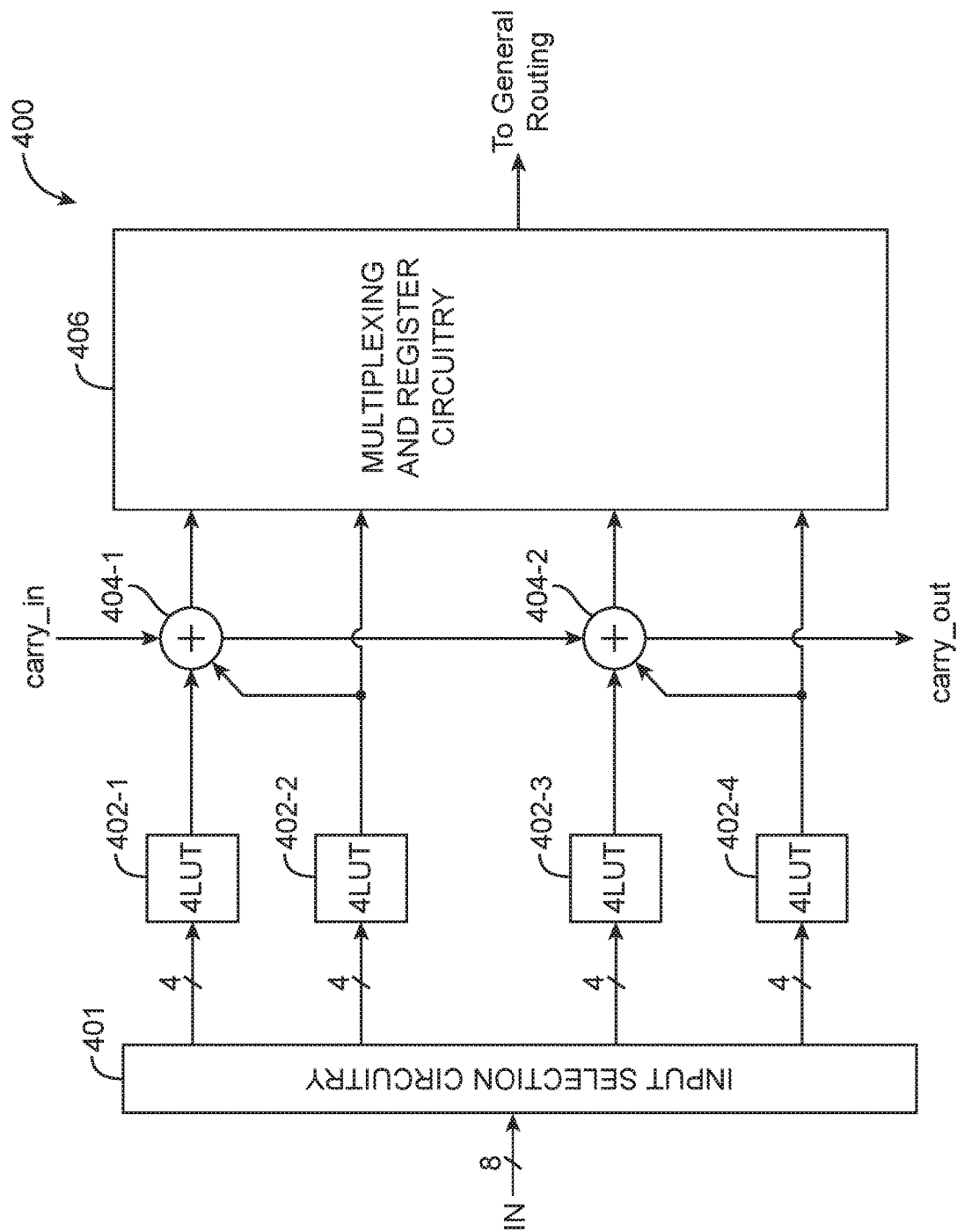
FIG. 4 is a diagram of an adaptive logic module that only supports binary addition.

FIG. 4 is a diagram of an adaptive logic module (ALM) 400 that only supports binary addition. As shown in FIG. 4, ALM 400 includes input selection circuitry 401, four 4-input LUT circuits 402-1, 402-2, 402-3, and 402-4, a carry chain with only two adders 404-1 and 404-2, and associated multiplexing and register circuitry 406. Input selection circuitry 401 is configured to receive eight input bits and selectively routes four input bits to each of the 4-input LUTs 402.

The first adder 404-1 has a first adder input connected to the output of first LUT 402-1, a second adder input connected to the output of second LUT 402-2, a carry input that receives signal carry_in from a preceding ALM, a sum output connected to multiplexing and register circuitry 406, and a carry output. The second adder 404-2 has a first adder input connected to the output of third LUT 402-3, a second adder input connected to the output of fourth LUT 402-4, a carry input connected to the carry output of adder 404-1, a sum output connected to multiplexing and register circuitry 406, and a carry output at which signal carry_out is provided to a subsequent ALM. Multiplexing and register circuitry 406 is then coupled to general routing circuitry within the programmable device.

Configured in this way, inputs to the two adders can only come from the LUTs in the same half of the ALM (i.e., adder 404-1 only receives signals from LUTs 402-1 and 402-2, whereas adder 404-2 only receives signals from LUTs 402-3 and 402-4). As a result, only binary addition (i.e., addition of two different input words) can be supported by ALM 400.

Figure 5:
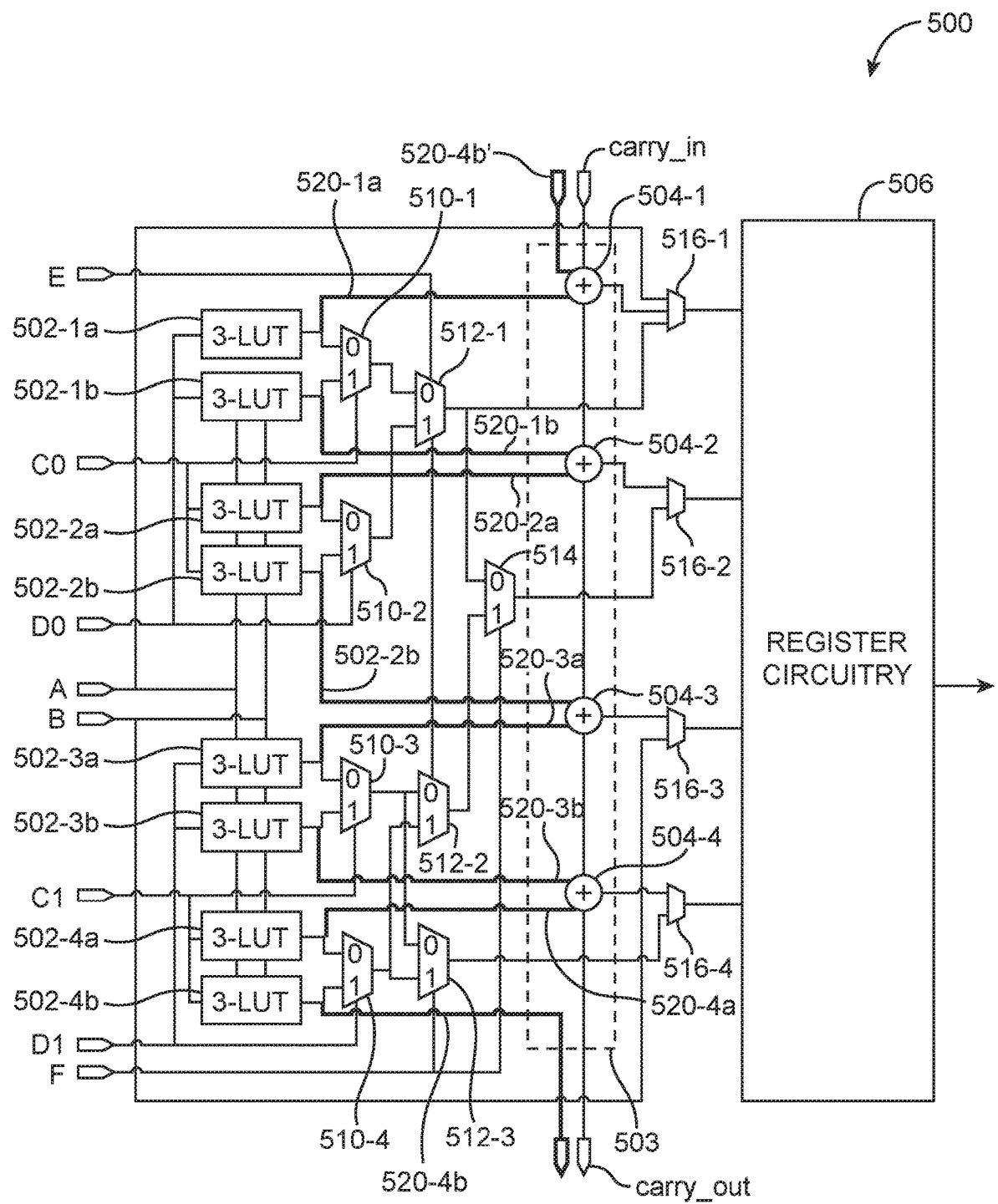
FIG. 5 is a circuit diagram of an illustrative logic cell that includes more than two full adder circuits to provide augmented arithmetic density in accordance with an embodiment.

In accordance with an embodiment, FIG. 5 is a circuit diagram of an illustrative logic cell 500 that includes more than two full adder circuits to provide augmented arithmetic density. Logic cell 500 may be similar to logic cell 34 of the type described in connection with FIG. 2. Logic cell 500 may be configured to receive eight input signals A, B, C0, C1, D0, D1, E, and F.

As shown in FIG. 5, logic cell 500 may include four 4-input lookup table (LUT) circuits, each of which is decomposed into two 3-input LUT circuits (each of which is sometimes referred to here as a "3-LUT") and a selector multiplexing circuit 510. For example, a first 4-input LUT may include a first 3-LUT 502-1a, a second 3-LUT 502-1b, and an associated multiplexer 510-1 configured to receive signals from LUTs 502-1a and 502-1b; a second 4-input LUT may include a first 3-LUT 502-2a, a second 3-LUT 502-2b, and an associated multiplexer 510-2 configured to receive signals from LUTs 502-2a and 502-2b; a third 4-input LUT may include a first 3-LUT 502-3a, a second 3-LUT 502-3b, and an associated multiplexer 510-3 configured to receive signals from LUTs 502-3a and 502-3b; and a fourth 4-input LUT may include a first 3-LUT 502-4a, a second 3-LUT 502-4b, and an associated multiplexer 510-4 configured to receive signals from LUTs 502-4a and 502-4b.

Input signals A and B may be fed to each of the 3-LUTs. The third input of LUTs 502-1a and 502-1b may be configured to receive signal D0; the third input of LUTs 502-2a and 502-2b may be configured to receive signal C0; the third input of LUTs 502-3a and 502-3b may be configured to receive signal D1; and the third input of LUTs 502-4a and 502-4b may be configured to receive signal C1. Selector multiplexer 510-1 may be controlled by input signal C0; selector multiplexer 510-2 may be controlled by input signal D0; selector multiplexer 510-3 may be controlled by input signal C1; and selector multiplexer 510-4 may be controlled by input signal D1. There are no multiplexers at the inputs of LUTs 502, which reduces the complexity of logic cell 500.

Note that while multiplexer 510-1 is controlled by input signal C0, the 3-LUTs 502-1a and 502-1b feeding it are configured to receive a different input signal D0. Similarly, while multiplexer 510-2 is controlled by input signal D0, the 3-LUTs 502-2a and 502-2b feeding it are configured to receive a different input signal C0. Swapping the input connection patterns in this way can also help reduce the need for additional multiplexers at the LUT inputs.

Logic cell 500 may further include selector multiplexers 512-1, 512-2, 512-3, 514, a carry chain 503, output multiplexers 516-1, 516-2, 516-3, and 516-4, and associated register circuitry 506 coupled to general routing circuitry within device 10 (see FIG. 1). Multiplexer 512-1 may have a first (0) input coupled to the output of multiplexer 510-1, a second (1) input coupled to the output of multiplexer 510-2, a control input that receives input signal E, and an output. Multiplexer 512-2 may have a first (0) input coupled to the output of multiplexer 510-3, a second (1) input coupled to the output of multiplexer 510-4, a control input that receives input signal E, and an output. Multiplexer 512-3 may have a first (0) input coupled to the output of multiplexer 510-3, a second (1) input coupled to the output of multiplexer 510-4, a control input that receives input signal F, and an output. Multiplexer 514 may have a first (0) input coupled to the output of multiplexer 512-1, a second (1) input coupled to the output of multiplexer 512-2, a control input that receives input signal F, and an output.

Carry chain 503 may include full adder circuits 504-1, 504-2, 504-3, and 504-4. Each of the full adder circuits has three input terminals (e.g., two normal input ports and one carry-in port) and two output terminals (e.g., a sum port and a carry-out port). Full adder 504-1 may have a first adder input coupled to a shared output path 520-4b' routed directly from LUT 502-4b of a preceding logic cell 500, a second adder input connected directly to the output of LUT 502-1a via direct connection path 520-1a, a carry input that receives signal carry_in from the preceding logic cell, a sum output, and a carry output. This example assumes that multiple logic cells 500 may be connected sequentially in a chain such that the carry chain propagates carry signals from one logic cell to the next.

Full adder 504-2 may have a first adder input connected directly to the output of LUT 502-1b via direct connection path 520-1b, a second adder input connected directly to the output of LUT 502-2a via direct connection path 520-2a, a carry input connected to the carry output of adder 504-1, a sum output, and a carry output. Full adder 504-3 may have a first adder input connected directly to the output of LUT 502-2b via direct connection path 520-2b, a second adder input connected directly to the output of LUT 502-3a via direct connection path 520-3a, a carry input connected to the carry output of adder 504-2, a sum output, and a carry output. Full adder 504-4 may have a first adder input connected directly to the output of LUT 502-3b via direct connection path 520-3b, a second adder input connected directly to the output of LUT 502-4a via direct connection path 520-4a, a carry input connected to the carry output of adder 504-3, a sum output, and a carry output. The output of LUT 502-4b may be fed directly to a subsequent logic cell 500 in the chain via direct routing path 520-4b.

Output multiplexer 516-1 may be configured to select from among input signal A, the sum output of full adder 504-1, and the output of multiplexer 512-1. Output multiplexer 516-2 may be configured to select from between the sum output of full adder 504-2 and the output of multiplexer 514. Output multiplexer 516-3 may be configured to select from between the sum output of full adder 504-3 and input signal B. Output multiplexer 516-4 may be configured to select from between the sum output of full adder 504-4 and the output of multiplexer 512-3.

Configured in this way, the 4-bit carry chain 503 can still operate like a 2-bit ripple carry adder, but is capable of 3-bit or 4-bit addition and to also implement soft multipliers. The direct connection paths 520-1a, 520-1b, 520-2a, 520-2b, 520-3a, 520-3b, 520-4a, and 520-4b from the output of the 3-LUTs 502 to the full adders 504 allows logic cell 500 to utilize and exploit the increased number of internal full adders to provide improved arithmetic densities at minimal cost.

In accordance with some embodiments, one or more logic cells 500 of the type described in connection with FIG. 5 may be used to implement soft multipliers on a programmable integrated circuit 10. FIG. 6 shows a table 600 illustrating how a 6-by-6 unsigned multiplication can be computed. The two 6-bit inputs are A and B, where A includes bits {a5, a4, a3, a2, a1, a0} and where B includes bits {b5, b4, b3, b2, b1, b0}. As shown in table 600, row 601 represents the product of A*b0; row 602 represents the product of A*b1 left shifted by one bit position; row 603 represents the product of A*b2 left shifted by one more bit position; row 604 represents the product of A*b3 left shifted by one more bit position; row 605 represents the product of A*b4 left shifted by another bit position; and row 606 represents the product of A*b5 left shifted by yet another bit position.

Row 607 represents a first partial result {s7, s6, . . . , s1, s0} resulting from the sum of the bits in rows 601 and 602. Row 608 represents a second partial result {t7, t6, . . . , t1, t0} resulting from the sum of the bits in rows 603 and 604. Row 909 represents a third partial result {u7, u6, . . . , u1, u0} resulting from the sum of the bits in rows 605 and 606.

Figure 7A:
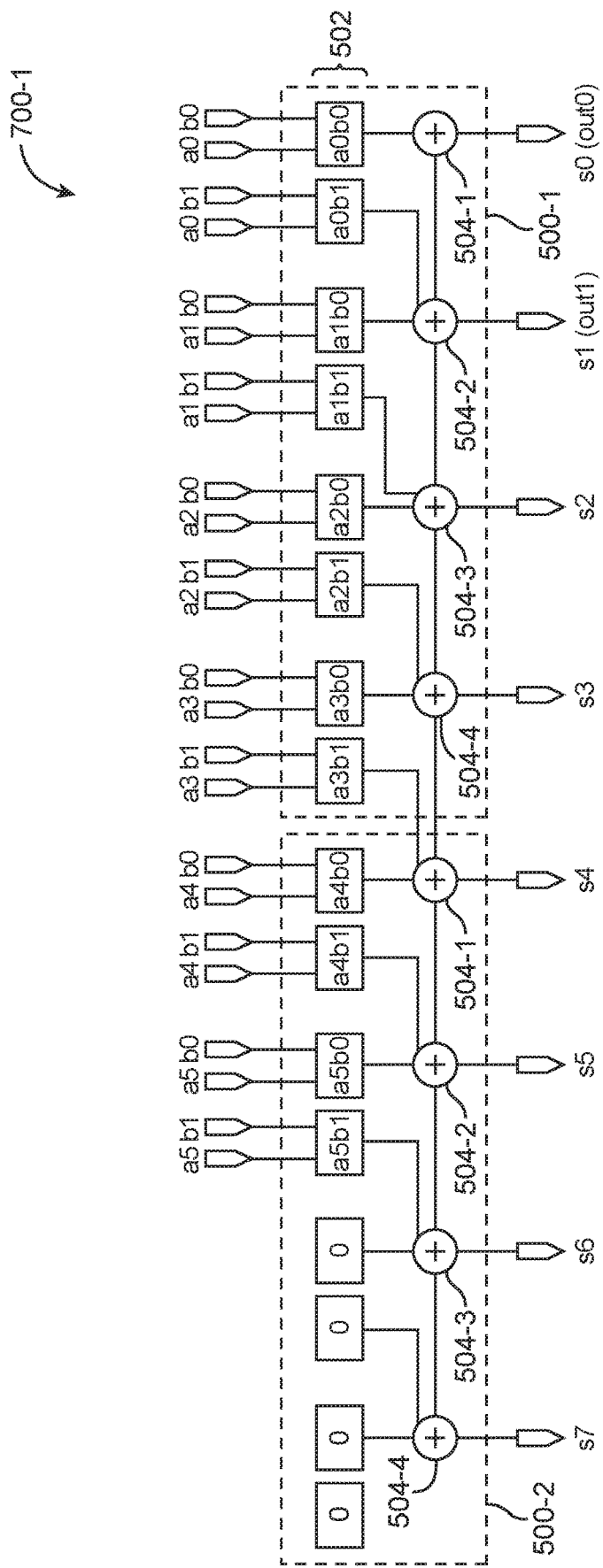
FIG. 7A is a diagram illustrating how a first group of logic cells can be configured to compute a first partial result in accordance with an embodiment.

FIG. 7A is a diagram illustrating how a first group of logic cells 700-1 can be configured to compute the first partial result {s7:s0}. As shown in FIG. 7A, first logic cell group 700-1 may include two logic cells 500-1 and 500-2 that are serially connected. In particular, logic cell 500-1 may include a first 3-LUT 502 configured to implement the product of bits a0*b0, a second 3-LUT 502 configured to implement the product of bits a0*b1, a third 3-LUT 502 configured to implement the product of bits a1*b0, a fourth 3-LUT 502 configured to implement the product of bits a1*b1, a fifth 3-LUT 502 configured to implement the product of a2*b0, a sixth 3-LUT 502 configured to implement the product of a2*b1, a seventh 3-LUT 502 configured to implement the product of a3*b0, and an eighth 3-LUT 502 configured to implement the product of a3*b1. Note that only the directly connection paths linking the 3-LUTs 502 to the full adders 504 are shown; the multiplexers are omitted to avoid obscuring the present embodiments. Although each of the 3-LUTs 502 have three total available inputs, at least some of the 3-LUTs shown in FIG. 7A receive input signals at only two out of the three inputs. This helps eliminate the need for additional input multiplexers at the inputs of the LUTs 502.

Configured in this way, the output of full adder 504-1 in cell 500-1 may be s0, which is simply the least significant bit (LSB) "out0" of the final multiplier output. The output of full adder 504-2 in cell 500-1 may be s1, which is the second LSB "out1" of the final multiplier output. The output of adder 504-3 in cell 500-1 may be equal to s2, and the output of adder 504-4 in cell 500-1 may be equal to s3. Note that each of the 3-input LUTs 502 only receive two input bits (e.g., the 3$^{rd}$ input may be unused when implementing this particular multiplier).

Logic cell 500-2 may include a first 3-LUT 502 configured to implement the product of bits a4*b0, a second 3-LUT 502 configured to implement the product of bits a4*b1, a third 3-LUT 502 configured to implement the product of bits a5*b0, and a fourth 3-LUT 502 configured to implement the product of bits a5*b1. The remaining four 3-LUTs 502 may be unused and may therefore be configured to output logic zeros. Configured in this way, the output of full adder 504-1 in cell 500-2 may be equal to s4; the output of full adder 504-2 in cell 500-2 may be equal to s5; the output of adder 504-3 in cell 500-2 may be equal to s6, and the output of adder 504-4 in cell 500-2 may be equal to s7. Note that at least some of the 3-input LUTs 502 may be idle (e.g., the fifth through eighth LUTs do not perform any computation when implementing this particular multiplier).

Figure 7B:
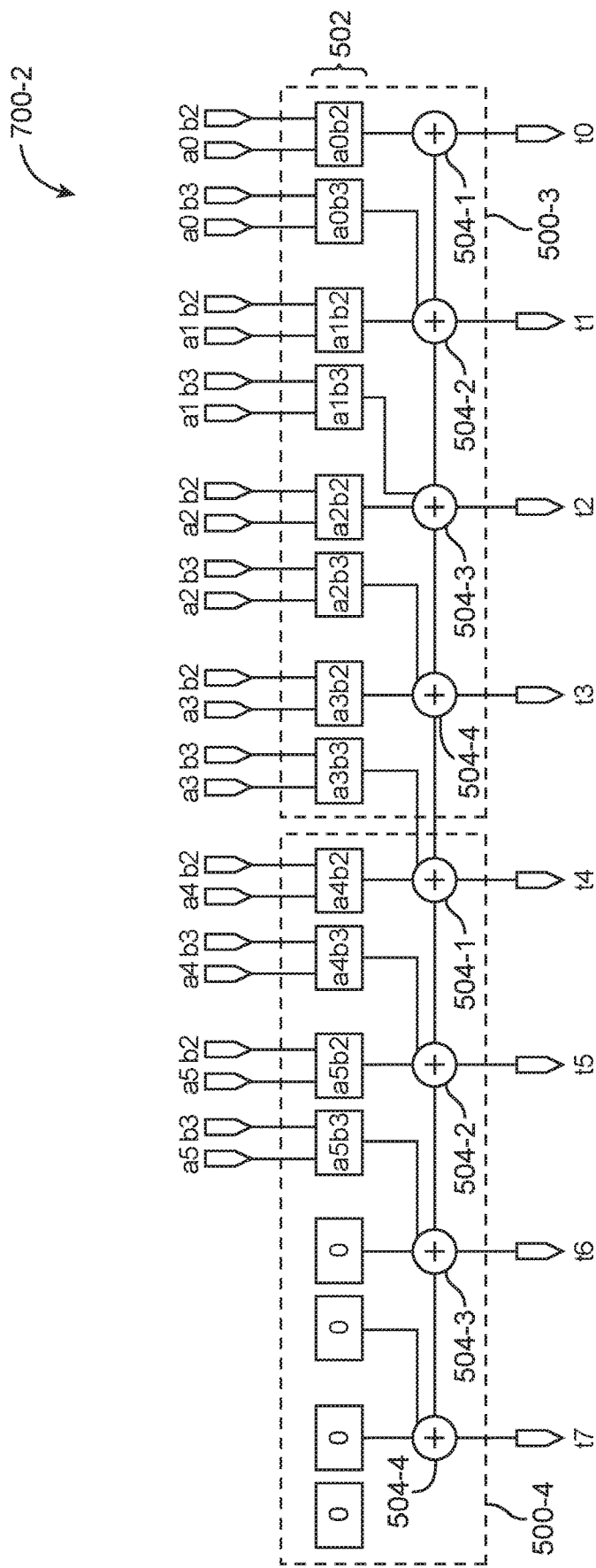
FIG. 7B is a diagram illustrating how a second group of logic cells can be configured to compute a second partial result in accordance with an embodiment.

FIG. 7B is a diagram illustrating how a second group of logic cells 700-2 can be configured to compute the second partial result {t7:t0}. As shown in FIG. 7B, second logic cell group 700-2 may include two logic cells 500-3 and 500-4 that are serially connected. In particular, logic cell 500-3 may include a first 3-LUT 502 configured to implement the product of bits a0*b2, a second 3-LUT 502 configured to implement the product of bits a0*b3, a third 3-LUT 502 configured to implement the product of bits a1*b2, a fourth 3-LUT 502 configured to implement the product of bits a1*b3, a fifth 3-LUT 502 configured to implement the product of a2*b2, a sixth 3-LUT 502 configured to implement the product of a2*b3, a seventh 3-LUT 502 configured to implement the product of a3*b2, and an eighth 3-LUT 502 configured to implement the product of a3*b3.

Configured in this way, the output of full adder 504-1 in cell 500-3 may be equal to t0; the output of full adder 504-2 in cell 500-3 may be equal to t1; the output of adder 504-3 in cell 500-3 may be equal to t2; and the output of adder 504-4 in cell 500-3 may be equal to t3.

Logic cell 500-4 may include a first 3-LUT 502 configured to implement the product of bits a4*b2, a second 3-LUT 502 configured to implement the product of bits a4*b3, a third 3-LUT 502 configured to implement the product of bits a5*b2, and a fourth 3-LUT 502 configured to implement the product of bits a5*b3. The remaining four 3-LUTs 502 may be unused/idle and may therefore be configured to output logic zeros. Configured in this way, the output of full adder 504-1 in cell 500-4 may be equal to t4; the output of full adder 504-2 in cell 500-4 may be equal to t5; the output of adder 504-3 in cell 500-4 may be equal to t6, and the output of adder 504-4 in cell 500-4 may be equal to t7.

Figure 7C:
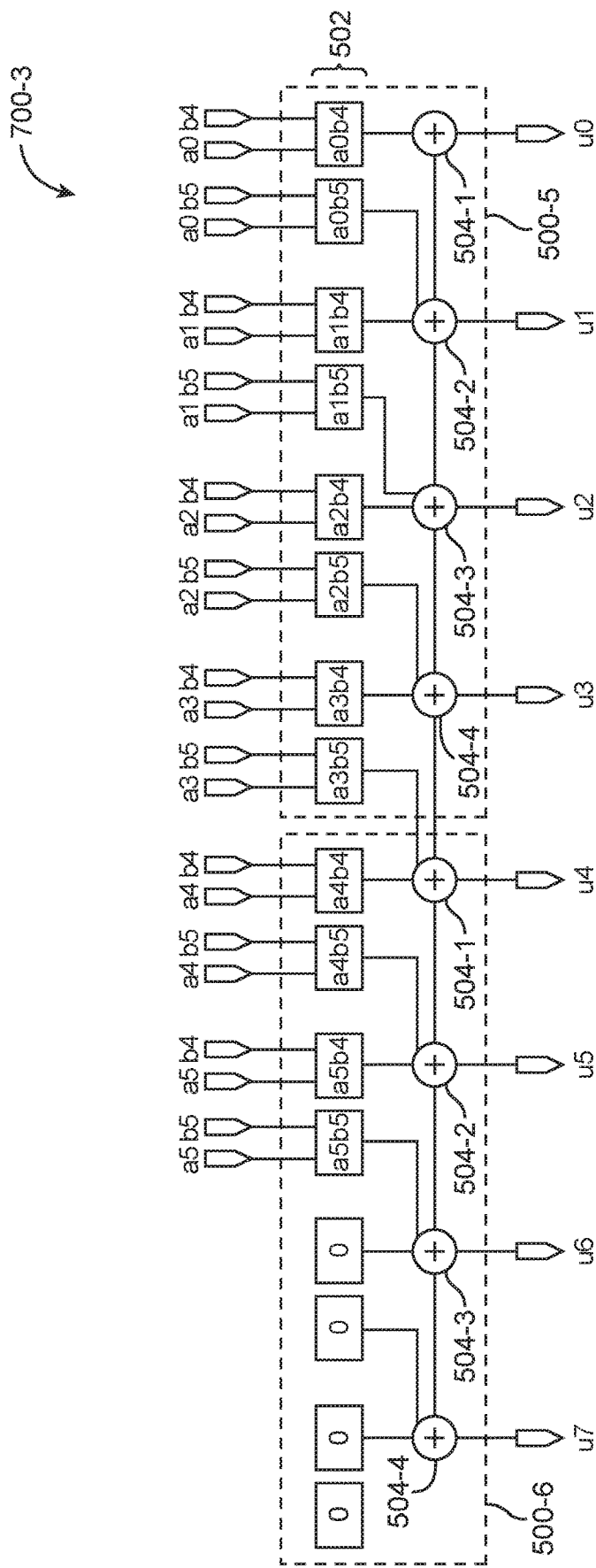
FIG. 7C is a diagram illustrating how a third group of logic cells can be configured to compute a third partial result in accordance with an embodiment.

FIG. 7C is a diagram illustrating how a third group of logic cells 700-3 can be configured to compute the third partial result {u7:u0}. As shown in FIG. 7C, third logic cell group 700-3 may include two logic cells 500-5 and 500-6 that are serially connected. In particular, logic cell 500-5 may include a first 3-LUT 502 configured to implement the product of bits a0*b4, a second 3-LUT 502 configured to implement the product of bits a0*b5, a third 3-LUT 502 configured to implement the product of bits a1*b4, a fourth 3-LUT 502 configured to implement the product of bits a1*b5, a fifth 3-LUT 502 configured to implement the product of a2*b4, a sixth 3-LUT 502 configured to implement the product of a2*b5, a seventh 3-LUT 502 configured to implement the product of a3*b4, and an eighth 3-LUT 502 configured to implement the product of a3*b5.

Configured in this way, the output of full adder 504-1 in cell 500-5 may be equal to u0; the output of full adder 504-2 in cell 500-5 may be equal to u1; the output of adder 504-3 in cell 500-5 may be equal to u2; and the output of adder 504-4 in cell 500-5 may be equal to u3.

Logic cell 500-6 may include a first 3-LUT 502 configured to implement the product of bits a4*b4, a second 3-LUT 502 configured to implement the product of bits a4*b5, a third 3-LUT 502 configured to implement the product of bits a5*b4, and a fourth 3-LUT 502 configured to implement the product of bits a5*b5. The remaining four 3-LUTs 502 may be unused/idle and may therefore be configured to output logic zeros. Configured in this way, the output of full adder 504-1 in cell 500-6 may be equal to u4; the output of full adder 504-2 in cell 500-6 may be equal to u5; the output of adder 504-3 in cell 500-6 may be equal to u6, and the output of adder 504-4 in cell 500-6 may be equal to u7.

Figure 7D:
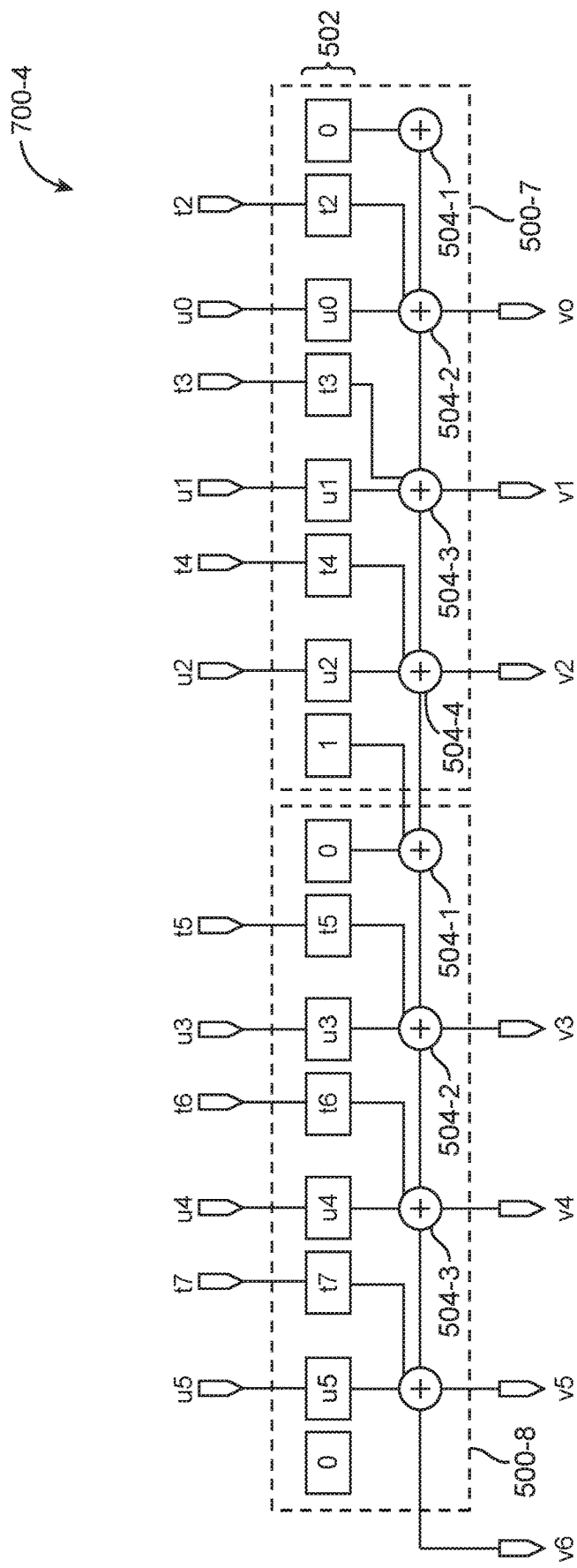
FIG. 7D is a diagram illustrating how a fourth group of logic cells can be configured to compute a fourth partial result in accordance with an embodiment.

FIG. 7D is a diagram illustrating how a fourth group of logic cells 700-4 can be configured to compute the fourth partial result {v7:v0}. The fourth partial result may be computed as a function of a subset of the second partial result and a subset of the third partial result (see portion 650 in FIG. 6). As shown in FIG. 7D, fourth logic cell group 700-4 may include two logic cells 500-7 and 500-8 that are serially connected. In particular, logic cell 500-7 may include a first 3-LUT 502 that is idle (and outputs logic "0"), a second 3-LUT 502 that simply passes through bit t2, a third 3-LUT 502 that simply passes through bit u0, a fourth 3-LUT 502 that passes through bit t3, a fifth 3-LUT 502 that passes through bit u1, a sixth 3-LUT 502 that passes through bit t4, a seventh 3-LUT 502 that passes through t4, and an eight 3-LUT 502 that outputs a logic "1". Note that each of the 3-input LUTs 502 in logic cell group 700-4 only receives at most one input bit (e.g., the $2^{nd}$ and $3^{rd}$ inputs may be unused when implementing this particular multiplier). Receiving input signals at only one out of the three total available inputs helps eliminate the need for additional input multiplexers at the inputs of LUTs 502.

Configured in this way, the sum output of full adder 504-1 in cell 500-7 is unused; the output of full adder 504-2 in cell 500-7 may be equal to v0; the output of adder 504-3 in cell 500-7 may be equal to v1; and the output of adder 504-4 in cell 500-7 may be equal to v2.

Logic cell 500-8 may include a first 3-LUT 502 that is idle (or outputs logic "0"), a second 3-LUT 502 that simply passes through bit t5, a third 3-LUT 502 that simply passes through bit u3, a fourth 3-LUT 502 that passes through bit t6, a fifth 3-LUT 502 that passes through bit u4, a sixth 3-LUT 502 that passes through bit t7, a seventh 3-LUT 502 that passes through u5, and an eight 3-LUT 502 that outputs a logic "0" or is unused. Configured in this way, the sum output of full adder 504-1 in cell 500-8 is unused; the output of full adder 504-2 in cell 500-8 may be equal to v3; the output of adder 504-3 in cell 500-8 may be equal to v4; the sum output of adder 504-4 in cell 500-8 may be equal to v5; and the carry output of adder 504-4 in cell 500-8 may be equal to v6.

As illustrated above in at least the example of FIG. 7D, the 3-LUTs 502 have the option of outputting constant zeros or ones. This capability allows the carry chain to selectively skip an adder bit. For instance, full adder 504-1 in logic cell 500-8 is effectively skipped (i.e., the sum output port of that full adder is unused or ignored) by routing the carry out from adder 504-4 in preceding logic cell 500-7 through full adder 504-1 in logic cell 500-8, which does not requiring any additional multiplexing. Since no additional multiplexing control is required, the skipping of bits may be exclusively controlling via the mask programming of the 3-LUTs. By selectively skipping bits in this way, a logic cell is capable of summing two, three, or four bits. In other words, any one or more of the four full adders in carry chain 503 (see FIG. 5) can be skipped (e.g., only one of the four full adders may be active, only two of the four full adders may be active, only three of the four adders may be active, or all four of the full adders may be active).

Figure 7E:
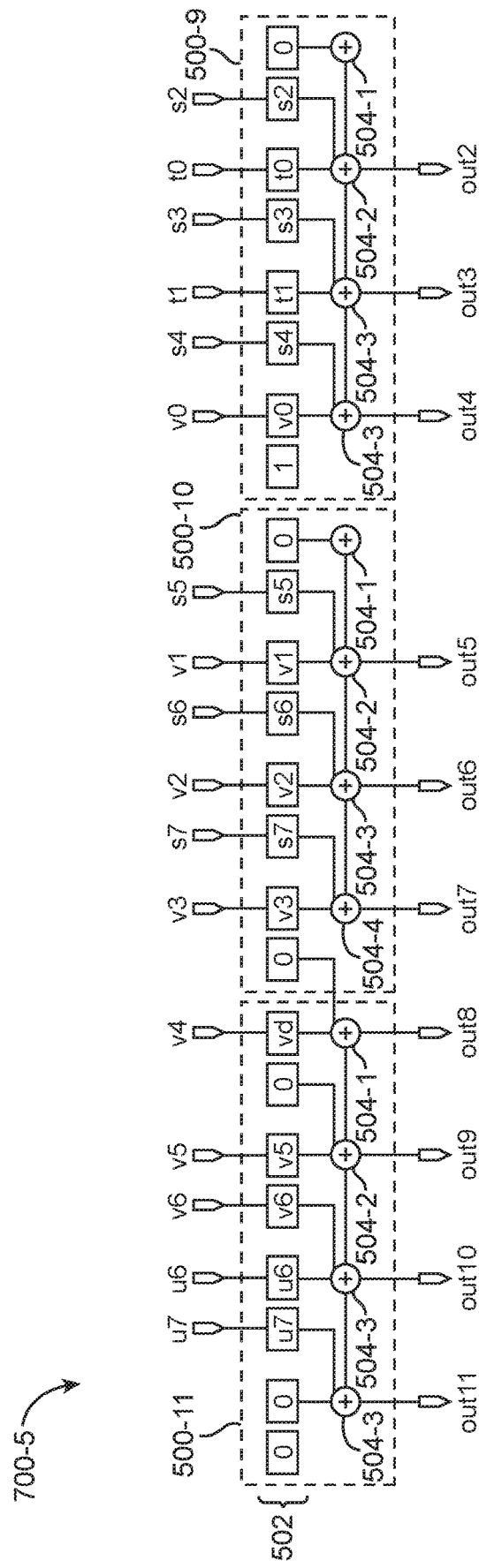
FIG. 7E is a diagram illustrating how a final group of logic cells can be configured to compute the final product by combining the first, second, third, and fourth partial results in accordance with an embodiment.

FIG. 7E is a diagram illustrating how a final group of logic cells 700-5 can be configured to compute the final multiplier product by combining the first, second, third, and fourth partial results. As shown in FIG. 7E, final logic cell group 700-5 may include three logic cells 500-9, 500-10, and 500-11 that are serially connected. In particular, logic cell 500-9 may include a first 3-LUT 502 that is idle (and outputs logic "0"), a second 3-LUT 502 that simply passes through bit s2, a third 3-LUT 502 that simply passes through bit t0, a fourth 3-LUT 502 that passes through bit s3, a fifth 3-LUT 502 that passes through bit t1, a sixth 3-LUT 502 that passes through bit s4, a seventh 3-LUT 502 that passes through bit v0, and an eight 3-LUT 502 that outputs a logic "1". Note that each of the 3-input LUTs 502 in final logic cell group 700-5 only receives at most one input bit (e.g., the $2^{nd}$ and $3^{rd}$ inputs may be unused when implementing this particular multiplier).

Configured in this way, the sum output of full adder 504-1 in cell 500-9 is unused; the sum output of full adder 504-2 in cell 500-9 may be equal to out2; the sum output of adder 504-3 in cell 500-9 may be equal to out3; and the sum output of adder 504-4 in cell 500-9 may be equal to out4.

Logic cell 500-10 may include a first 3-LUT 502 that is idle (or outputs logic "0"), a second 3-LUT 502 that simply passes through bit s5, a third 3-LUT 502 that simply passes through bit v1, a fourth 3-LUT 502 that passes through bit s6, a fifth 3-LUT 502 that passes through bit v2, a sixth 3-LUT 502 that passes through bit s7, a seventh 3-LUT 502 that passes through v3, and an eight 3-LUT 502 that outputs a logic "0" or is unused. Configured in this way, the sum output of full adder 504-1 in cell 500-10 is unused; the sum output of full adder 504-2 in cell 500-10 may be equal to out5; the sum output of adder 504-3 in cell 500-10 may be equal to out6; and the sum output of adder 504-4 in cell 500-10 may be equal to out7. Note that adder bit 504-1 of logic cell 500-10 is being skipped (e.g., by setting its inputs to logic "0" and logic "1" and propagating through its carry-in signal).

Logic cell 500-11 may include a first 3-LUT 502 that passes through bit v4, a second 3-LUT 502 that is idle (e.g., outputs logic "0"), a third 3-LUT 502 that passes through bit v5, a fourth 3-LUT 502 that passes through bit v6, a fifth 3-LUT 502 that passes through bit u6, and a sixth 3-LUT 502 that passes through bit u7. The remaining seventh and eighth 3-LUTs 502 are configured to output a logic "0" (i.e., unused). Configured in this way, the sum output of full adder 504-1 in cell 500-11 may be equal to out8; the sum output of full adder 504-2 in cell 500-11 may be equal to out9; the sum output of adder 504-3 in cell 500-11 may be equal to out10; and the sum output of adder 504-4 in cell 500-11 may be equal to out11.

Multiplier outputs bits {out11:out0} generated using the five logic cell groups 700 shown in FIGS. 7A-7E in this way is merely illustrative. If desired, the overall multiplier can optionally be fractally packed, meaning that subsequent multipliers can be stacked on an unbroken carry chain that continues across multiple logic blocks 18 (see FIG. 2). Any unused logic cell within a logic block 18 can be utilized or allocated for other logic functions. An example of such reserved logic function is the sign calculation for signed dot products.

Figure 8:
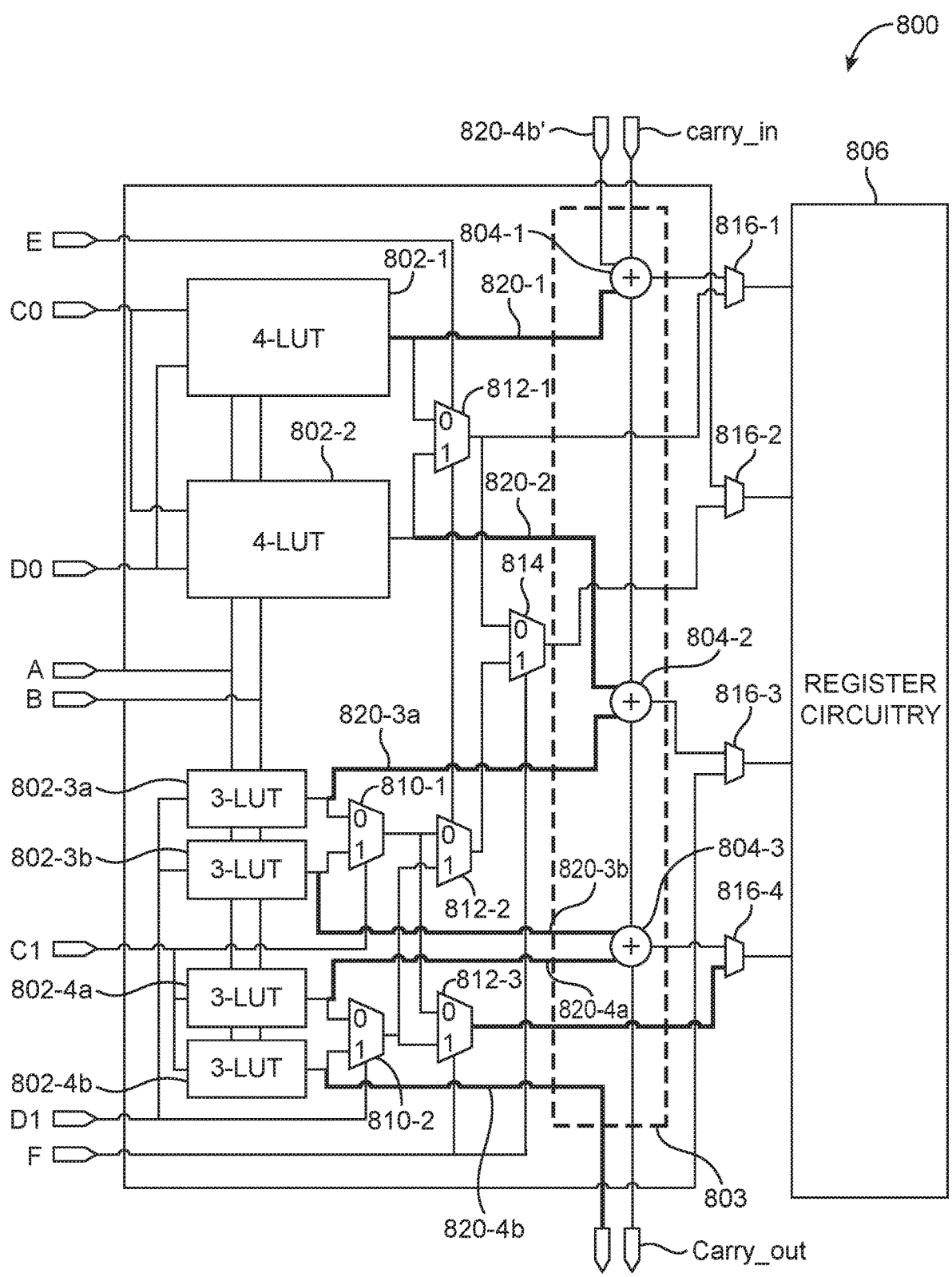
FIG. 8 is a diagram of an illustrative logic cell that includes only three two full-adder circuits to provide augmented arithmetic density in accordance with an embodiment.

The embodiments shown in FIGS. 5-7 in which a logic cell 500 includes at least four full adder circuits 504 to provide enhanced arithmetic density (e.g., 2× arithmetic density over convention ALM designs with only two adders) is merely illustrative and are not intended to limit the scope of the present embodiments. In accordance with another suitable arrangement, FIG. 8 is a diagram of an illustrative logic cell 800 that includes only three two full-adder circuits. As shown in FIG. 8, the upper half of cell 800 includes two 4-input LUTs (each with only one direct connection to a corresponding fuller adder to offer 1× arithmetic density), whereas the bottom half of cell 800 uses four 3-input LUTs while offering 2× arithmetic density. Logic cell 800 may be similar to logic cell 34 of the type described in connection with FIG. 2. Logic cell 800 may be configured to receive eight input signals A, B, C0, C1, D0, D1, E, and F.

As shown in FIG. 8, logic cell 500 may include four 4-input lookup table (LUT) circuits, each of which is decomposed into two 3-input LUT circuits (each of which is sometimes referred to here as a "3-LUT") and a selector multiplexing circuit 510. For example, the first two 4-input LUTs may include 4-LUT 802-1 and 802-2; a third 4-input LUT may include a first 3-LUT 802-3a, a second 3-LUT 802-3b, and an associated multiplexer 810-1 configured to receive signals from LUTs 802-3a and 802-3b; and a fourth 4-input LUT may include a first 3-LUT 802-4a, a second 3-LUT 802-4b, and an associated multiplexer 810-2 configured to receive signals from LUTs 802-4a and 802-4b.

Input signals A and B may be fed to each of the upper two 4-LUTs and each of the bottom four 3-LUTs. The third input of LUTs 802-1 and 802-2 may be configured to receive signal C0, whereas the fourth input of LUTs 802-1 and 802-2 may be configured to receive signal D0. The third input of LUTs 802-3a and 802-3b may be configured to receive signal D1, whereas the third input of LUTs 802-4a and 802-4b may be configured to receive signal C1. Selector multiplexer 810-1 may be controlled by input signal C1, whereas selector multiplexer 810-2 may be controlled by input signal D1.

Logic cell 800 may further include selector multiplexers 812-1, 812-2, 812-3, 814, a carry chain 803, output multiplexers 816-1, 816-2, 816-3, and 816-4, and associated register circuitry 806 coupled to general routing circuitry within device 10 (see FIG. 1). Multiplexer 812-1 may have a first (0) input coupled to the output of 4-LUT 802-1, a second (1) input coupled to the output of 4-LUT 802-2, a control input that receives input signal E, and an output. Multiplexer 812-2 may have a first (0) input coupled to the output of multiplexer 810-1, a second (1) input coupled to the output of multiplexer 810-2, a control input that receives input signal E, and an output. Multiplexer 812-3 may have a first (0) input coupled to the output of multiplexer 810-1, a second (1) input coupled to the output of multiplexer 810-2, a control input that receives input signal F, and an output. Multiplexer 814 may have a first (0) input coupled to the output of multiplexer 812-1, a second (1) input coupled to the output of multiplexer 812-2, a control input that receives input signal F, and an output.

Carry chain 803 may include only three full adder circuits 804-1, 804-2, and 804-3. Each of the full adder circuits has three input terminals (e.g., two normal input ports and one carry-in port) and two output terminals (e.g., a sum port and a carry-out port). Full adder 804-1 may have a first adder input coupled to a shared output path 820-4b' routed directly from LUT 802-4b of a preceding logic cell 800, a second adder input connected directly to the output of LUT 802-1 via connection path 820-1a, a carry input that receives signal carry_in from the preceding logic cell, a sum output, and a carry output. This example assumes that multiple logic cells 800 may be connected serially in a chain such that the carry chain propagates carry signals from one logic cell to the next.

Full adder 804-2 may have a first adder input connected directly to the output of 4-LUT 802-2 via connection path 820-2, a second adder input connected directly to the output of LUT 802-3a via direct connection path 820-3a, a carry input connected to the carry output of adder 804-1, a sum output, and a carry output. Full adder 804-3 may have a first adder input connected directly to the output of LUT 802-3b via direct connection path 820-3b, a second adder input connected directly to the output of LUT 802-4a via direct connection path 820-4a, a carry input connected to the carry output of adder 504-2, a sum output, and a carry output on which signal carry_out is propagated to a subsequent logic cell 800 in the chain. The output of LUT 802-4b may be fed directly to a subsequent logic cell 800 in the chain via direct routing path 820-4b.

Output multiplexer 816-1 may be configured to select from between the sum output of full adder 804-1 and the output of multiplexer 812-1. Output multiplexer 816-2 may be configured to select from between input signal A and the output of multiplexer 814. Output multiplexer 816-3 may be configured to select from between the sum output of full adder 804-2 and input signal B. Output multiplexer 816-4 may be configured to select from between the sum output of full adder 804-3 and the output of multiplexer 812-3.

Configured in this way, the 3-bit carry chain 503 can still operate like a 2-bit ripple carry adder, but is capable of supporting 3-bit or 4-bit addition and to also implement soft multipliers. The direct connection paths 820-3a, 820-3b, 820-4a, and 820-4b from the output of the 3-LUTs 502 to the full adders 504 allows logic cell 800 to utilize and exploit the increased number of internal full adders to provide improved arithmetic densities at minimal cost. If desired, any one or more of the three full adders in carry chain 803 can be skipped (e.g., only one of the three full adders may be used, only two of the three full adders may be used, or all three of the full adders may be used).

The examples of FIGS. 5-8 in which a logic cell is provided with three full adder circuits (where the number of full adder circuits is only one less than the number of 4-LUTs in the logic cell) or four full adder circuits (where the number of full adder circuits is equal to the number of 4-input LUTs in the logic cell or is equal to one-half of the number of 3-input LUTs in the logic cell) is merely illustrative. In general, a logic cell may be provided with more than two full adders, three or more full adders, four or more full adders, five or more full adders, six or more full adders, seven or more full adders, eight or more full adders, or any suitable number of full adders to provide the desired arithmetic/computational density. The number of full adders may be at least equal to or more than a third of the total number of 3-input LUTs in the logic cell, at least equal to or more than half the total number of 3-input LUTs in the logic cell, at least more than half the total number of 4-input LUTs in the logic cell, at least equal to or more than the total number of 4-input LUTs in the logic cell, or any other suitable number that is a function of the number of LUTs in the logic cell.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system (e.g., a data center) that includes one or more of the following components: a processor; memory; IC circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

EXAMPLES

The following examples pertain to further embodiments.

Example 1 is an integrated circuit, comprising: a programmable logic cell that comprises: a plurality of lookup table (LUT) circuits each of which has multiple inputs, wherein the plurality of lookup table circuits are used to compute a multiplication operation, and wherein at least one of the plurality of lookup table circuits is configured to receive input signals at only a subset of its multiple inputs when computing the multiplication operation; and a carry chain that includes a plurality of full adder circuits configured to receive signals from the plurality of LUT circuits, wherein the total number of full adder circuits in the carry chain is at least greater than half of the total number of LUT circuits in the programmable logic cell to optimize the arithmetic density of the programmable logic cell.

Example 2 is the integrated circuit of example 1, wherein the plurality of LUT circuits optionally comprises a plurality of 4-input lookup tables (LUTs), and wherein there are no multiplexers at the inputs of the plurality of LUT circuits within the programmable logic cell.

Example 3 is the integrated circuit of example 2, wherein the plurality of LUT circuits optionally comprises first, second, third, and fourth 4-input lookup tables (LUTs).

Example 4 is the integrated circuit of example 3, wherein: each of the four 4-input LUTs optionally comprises a first 3-input lookup table (LUT), a second 3-input lookup table (LUT), and a multiplexing circuit configured to receive signals from the first and second 3-input LUTs; the first and second 3-input lookup tables of the first 4-input LUT are configured to receive a first input signal; the multiplexing circuit of the first 4-input LUT is controlled by a second input signal that is different than the first input signal; the first and second 3-input lookup tables of the second 4-input LUT are configured to receive the second input signal; and the multiplexing circuit of the second 4-input LUT is controlled by the first input signal.

Example 5 is the integrated circuit of example 4, wherein the carry chain optionally comprises four full adder circuits.

Example 6 is the integrated circuit of example 5, wherein the four full adder circuits optionally have inputs that are directly connected to at least some of the first and second 3-input LUTs in the plurality of LUT circuits.

Example 7 is the integrated circuit of any one of examples 1-6, wherein at least one of the full adder circuits in the carry chain is optionally skipped.

Example 8 is the integrated circuit of any one of examples 1-7, wherein the programmable logic cell is optionally configured to generate partial results for the multiplication operation.

Example 9 is an integrated circuit, comprising: a first logic cell that includes a first plurality of 3-input lookup table (LUT) circuits and a first plurality of full adder circuits, wherein the total number of full adder circuits in the first logic cell is at least equal to half the total number of 3-input LUT circuits in the first logic cell; and a second logic cell connected in series with the first logic cell, wherein the second logic cell includes a second plurality of 3-input lookup table (LUT) circuits and a second plurality of full adder circuits, wherein the total number of full adder circuits in the second logic cell is at least equal to half the total number of 3-input LUT circuits in the second logic cell, and wherein at least one full adder circuit in the second plurality of full adder circuits within the second logic cell is directly connected to at least one 3-input LUT circuit in the first plurality of 3-input LUT circuits within the first logic cell.

Example 10 is the integrated circuit of example 9, wherein the total number of full adder circuits in the first logic cell is optionally equal to four.

Example 11 is the integrated circuit of example 10, wherein the total number of 3-input LUT circuits in the first logic cell is optionally equal to eight, and wherein there are no multiplexing circuits formed at the input of the 3-input LUT circuits in the first logic cell.

Example 12 is the integrated circuit of any one of examples 9-11, wherein the full adder circuits in the first and second logic cells are optionally used to compute partial results of a multiplication operation.

Example 13 is the integrated circuit of any one of examples 9-12, wherein each of the first plurality of 3-input LUT circuits optionally has three inputs, and wherein only two out of the three inputs are used in at least some of the first plurality of 3-input LUT circuits in the first logic cell.

Example 14 is the integrated circuit of any one of examples 9-13, wherein at least one of the second plurality of full adder circuits in the second logic cell is optionally skipped.

Example 15 is the integrated circuit of any one of examples 9-14, wherein each of the second plurality of 3-input LUT circuits optionally has three inputs, and wherein only one out of the three inputs is used in at least some of the second plurality of 3-input LUT circuits in the second logic cell.

Example 16 is an integrated circuit, comprising: a programmable logic cell that comprises: first lookup table and adder circuitry operable to provide a first arithmetic density; and second lookup table and adder circuitry operable to provide a second arithmetic density that is greater than the first arithmetic density.

Example 17 is the integrated circuit of example 16, wherein the second arithmetic density is optionally two times the first arithmetic density.

Example 18 is the integrated circuit of any one of examples 16-17, wherein the programmable logic cell optionally includes only three full adder circuits.

Example 19 is the integrated circuit of any one of examples 16-18, wherein the first lookup table circuitry optionally comprises two 4-input lookup tables, and wherein the second lookup table circuitry optionally comprises four 3-input lookup tables.

Example 20 is the integrated circuit of example 19, wherein the first and second lookup table and adder circuitries optionally include an adder chain, and wherein at least some of the four 3-input lookup tables in the second lookup table circuitry have outputs directly connected to the adder chain.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. An integrated circuit, comprising:
   a programmable logic cell that comprises:
      a plurality of lookup table (LUT) circuits each of which has multiple inputs and a multiplexer, wherein the plurality of lookup table circuits are used to compute a multiplication operation, and wherein at least one of the plurality of lookup table circuits is configured to receive input signals at only a subset of its multiple inputs when computing the multiplication operation; and
      a carry chain that includes a plurality of full adder circuits configured to receive signals from the plurality of LUT circuits, wherein the total number of full adder circuits in the carry chain is at least greater than half of the total number of LUT circuits in the programmable logic cell to optimize the arithmetic density of the programmable logic cell.

2. The integrated circuit of claim 1, wherein the plurality of LUT circuits comprises a plurality of 4-input lookup tables (LUTs), and wherein there are no multiplexers at the inputs of the plurality of LUT circuits within the programmable logic cell.

3. The integrated circuit of claim 2, wherein the plurality of LUT circuits comprises first, second, third, and fourth 4-input lookup tables (LUTs).

4. The integrated circuit of claim 3, wherein:
   each of the four 4-input LUTs comprises a first 3-input lookup table (LUT) and a second 3-input lookup table (LUT);
   the multiplexer in each of the four 4-input LUTs is configured to receive signals from the first and second 3-input LUTs in that 4-input LUT;
   the first and second 3-input lookup tables of the first 4-input LUT are configured to receive a first input signal;
   the multiplexer of the first 4-input LUT is controlled by a second input signal that is different than the first input signal;
   the first and second 3-input lookup tables of the second 4-input LUT are configured to receive the second input signal; and
   the multiplexer of the second 4-input LUT is controlled by the first input signal.

5. The integrated circuit of claim 4, wherein the carry chain comprises four full adder circuits.

6. The integrated circuit of claim 5, wherein the four full adder circuits have inputs that are directly connected to at least some of the first and second 3-input LUTs in the plurality of LUT circuits.

7. The integrated circuit of claim 1, wherein at least one of the full adder circuits in the carry chain is skipped.

8. The integrated circuit of claim 1, wherein the programmable logic cell is configured to generate partial results for the multiplication operation.

9. An integrated circuit, comprising:
   a first logic cell that includes a first plurality of 3-input lookup table (LUT) circuits and a first plurality of full adder circuits, wherein the total number of full adder circuits in the first logic cell is at least equal to half the total number of 3-input LUT circuits in the first logic cell; and
   a second logic cell connected in series with the first logic cell, wherein the second logic cell includes a second plurality of 3-input lookup table (LUT) circuits and a second plurality of full adder circuits, wherein the total number of full adder circuits in the second logic cell is at least equal to half the total number of 3-input LUT circuits in the second logic cell, and wherein at least one full adder circuit in the second plurality of full adder circuits within the second logic cell is directly connected to at least one 3-input LUT circuit in the first plurality of 3-input LUT circuits within the first logic cell.

10. The integrated circuit of claim 9, wherein the total number of full adder circuits in the first logic cell is equal to four.

11. The integrated circuit of claim 10, wherein the total number of 3-input LUT circuits in the first logic cell is equal to eight, and wherein there are no multiplexing circuits formed at the input of the 3-input LUT circuits in the first logic cell.

12. The integrated circuit of claim 9, wherein the full adder circuits in the first and second logic cells are used to compute partial results of a multiplication operation.

13. The integrated circuit of claim 9, wherein each of the first plurality of 3-input LUT circuits has three inputs, and wherein only two out of the three inputs are used in at least some of the first plurality of 3-input LUT circuits in the first logic cell.

14. The integrated circuit of claim 9, wherein at least one of the second plurality of full adder circuits in the second logic cell is skipped.

15. The integrated circuit of claim 9, wherein each of the second plurality of 3-input LUT circuits has three inputs, and wherein only one out of the three inputs is used in at least some of the second plurality of 3-input LUT circuits in the second logic cell.

16. An integrated circuit, comprising:
   a programmable logic cell that comprises:
      first lookup table and adder circuitry operable to provide a first arithmetic density; and
      second lookup table and adder circuitry operable to provide a second arithmetic density that is greater than the first arithmetic density, wherein the first lookup table and adder circuitry and the second lookup table and adder circuitry have the same number of 4-input lookup table circuits.

17. The integrated circuit of claim 16, wherein the second arithmetic density is two times the first arithmetic density.

18. The integrated circuit of claim 16, wherein the programmable logic cell includes only three full adder circuits.

19. The integrated circuit of claim 16, wherein the first lookup table circuitry comprises two 4-input lookup tables, and wherein the second lookup table circuitry comprises four 3-input lookup tables.

20. The integrated circuit of claim 19, wherein the first and second lookup table and adder circuitries include an adder chain, and wherein at least some of the four 3-input lookup tables in the second lookup table circuitry have outputs directly connected to the adder chain.

* * * * *